US009840665B2

(12) United States Patent
Vo et al.

(10) Patent No.: US 9,840,665 B2
(45) Date of Patent: Dec. 12, 2017

(54) QUANTUM DOT COMPOSITIONS

(71) Applicant: Nanoco Technologies, Ltd., Manchester (GB)

(72) Inventors: Cong-Duan Vo, Manchester (GB);
Imad Naasani, Manchester (GB);
Amilcar Pillay Narrainen, Manchester (GB); Yien Ta, Manchester (GB);
Emma Cherie Hogarth, Leyland (GB);
Alexandra Shannon, Manchester (GB);
Ross Jalmari Mera-Pirttijarvi, Manchester (GB); Elliot Stuart Poucher, Rudheath Northwich (GB)

(73) Assignee: Nanoco Technologies Ltd., Manchester (GB)

( * ) Notice: Subject to any disclaimer, the term of this patent is extended or adjusted under 35 U.S.C. 154(b) by 0 days.

(21) Appl. No.: 15/632,047

(22) Filed: Jun. 23, 2017

(65) Prior Publication Data
US 2017/0292070 A1 Oct. 12, 2017

Related U.S. Application Data

(63) Continuation of application No. 14/460,237, filed on Aug. 14, 2014, now Pat. No. 9,708,532.

(60) Provisional application No. 61/972,092, filed on Mar. 28, 2014.

(51) Int. Cl.
| | | |
|---|---|---|
| C09K 11/70 | (2006.01) |
| C09K 11/02 | (2006.01) |
| H01L 33/50 | (2010.01) |
| C08J 5/18 | (2006.01) |
| C08K 3/32 | (2006.01) |
| C08K 9/10 | (2006.01) |
| F21K 9/64 | (2016.01) |
| F21V 9/16 | (2006.01) |
| F21Y 115/10 | (2016.01) |

(52) U.S. Cl.
CPC ............ C09K 11/703 (2013.01); C08J 5/18 (2013.01); C08K 3/32 (2013.01); C08K 9/10 (2013.01); C09K 11/025 (2013.01); F21K 9/64 (2016.08); F21V 9/16 (2013.01); H01L 33/50 (2013.01); C08J 2300/12 (2013.01); C08J 2363/10 (2013.01); F21Y 2115/10 (2016.08)

(58) Field of Classification Search
CPC ..... C09K 11/02; C09K 11/025; C09K 11/565; C09K 11/70; C09K 11/703; H01L 33/50; B82Y 20/00; B82Y 40/00; Y10S 977/774; Y10S 977/783; Y10S 977/89; Y10S 977/95
USPC ........................................................ 252/582
See application file for complete search history.

(56) References Cited

PUBLICATIONS

Yang et al. (Fabrication of quantum dots-encoded microbeads with a simple capillary fluidic device and their application for biomolecule detection, Journal of Colloid and Interface Science, vol. 385, Issue 1, Nov. 1, 2012, pp. 8-14).*

\* cited by examiner

*Primary Examiner* — Ling Choi
*Assistant Examiner* — Chun-Cheng Wang
(74) *Attorney, Agent, or Firm* — Blank Rome LLP

(57) ABSTRACT

Multi-phase polymer films of quantum dots (QDs) and their use in light emitting devices (LEDs) are disclosed. The QDs are absorbed in a host matrix, which dispersed within an outer polymer phase. The host matrix is hydrophobic and is compatible with the surface of the QDs. The host matrix may also include a scaffolding material that prevents the QDs from agglomerating. The outer polymer is typically more hydrophilic and prevents oxygen from contacting the QDs.

10 Claims, 3 Drawing Sheets

QUANTUM DOT COMPOSITIONS

CROSS REFERENCE TO RELATED APPLICATIONS

This application is a continuation of U.S. patent application Ser. No. 14/460,237, filed Aug. 14, 2014, which claims the benefit of U.S. provisional Ser. No. 61/972,092, filed Mar. 28, 2014. The entire disclosures of each of these applications are hereby incorporated by reference as if set forth herein in their entirety.

BACKGROUND

Light-emitting diodes (LEDs) are becoming more important to modern day life and it is envisaged that they will become one of the major applications in many forms of lighting such as automobile lights, traffic signals, general lighting, liquid crystal display (LCD) backlighting and display screens. Currently, LED devices are typically made from inorganic solid-state semiconductor materials. The material used to make the LED determines the color of light produced by the LED. Each material emits light with a particular wavelength spectrum, i.e., light having a particular mix of colors. Common materials include AlGaAs (red), AlGaInP (orange-yellow-green), and AlGaInN (green-blue).

LEDs that produce white light, which is a mixture of fundamental colors (e.g., red, green and blue) or that produce light not available using the usual LED semiconductor materials are needed for many applications. Currently the most usual method of color mixing to produce a required color, such as white, is to use a combination of phosphorescent materials that are placed on top of the solid-state LED whereby the light from the LED (the "primary light") is absorbed by the phosphorescent material and then re-emitted at a different frequency (the "secondary light"). The phosphorescent material "down converts" a portion of the primary light.

Current phosphorescent materials used in down converting applications typically absorb UV or blue light and convert it to light having longer wavelengths, such as red or green light. A lighting device having a blue primary light source, such as a blue-emitting LED, combined with secondary phosphors that emit red and green light, can be used to produce white light.

The most common phosphor materials are solid-state semiconductor materials, such as trivalent rare-earth doped oxides or halophosphates. White emission can be obtained by blending a blue light-emitting LED with a green phosphor such as, $SrGa_2S_4:Eu^{2+}$ and a red phosphor such as, $SrSi_5Ni_8:Eu^{2+}$ or a UV light-emitting LED plus a yellow phosphor such as, $Sr_2P_2O_7:Eu^{2+}$; $Mu^{2+}$, and a blue-green phosphor. White LEDs can also be made by combining a blue LED with a yellow phosphor.

Several problems are associated with solid-state down-converting phosphors. Color control and color rendering may be poor (i.e., color rendering index (CRI)<75), resulting in light that is unpleasant under many circumstances. Also, it is difficult to adjust the hue of emitted light; because the characteristic color emitted by any particular phosphor is a function of the material the phosphor is made of. If a suitable material does not exist, then certain hues may simply be unavailable. There is thus a need in the art for down-converting phosphors having greater flexibility and better color rendering than presently available.

DESCRIPTION

Figure 1:
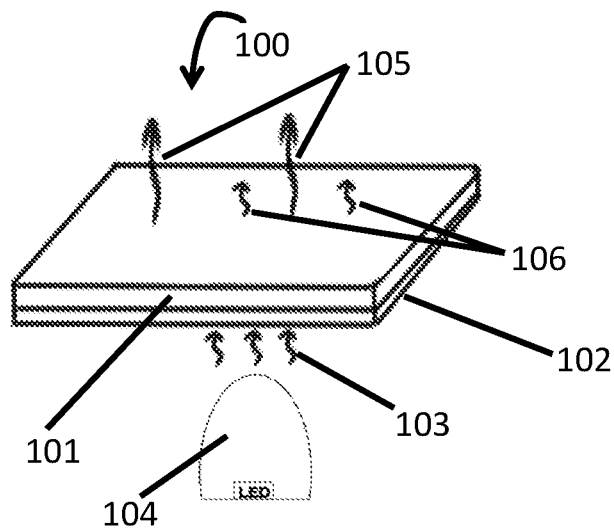
FIG. 1 illustrates a prior art system wherein a QD-containing film is coated onto a transparent substrate.

There has been substantial interest in exploiting the properties of compound semiconductor particles with dimensions on the order of 2-50 nm, often referred to as quantum dots (QDs) or nanocrystals. These materials are of commercial interest due to their size-tunable electronic properties that can be exploited in many commercial applications.

The most studied of semiconductor materials have been the chalcogenides II-VI materials namely ZnS, ZnSe, CdS, CdSe, CdTe; especially CdSe due to its tunability over the visible region of the spectrum. Reproducible methods for the large-scale production of these materials have been developed from "bottom up" techniques, whereby particles are prepared atom-by-atom, i.e., from molecules to clusters to particles, using "wet" chemical procedures.

Two fundamental factors, both related to the size of the individual semiconductor nanoparticles, are responsible for their unique properties. The first is the large surface-to-volume ratio. As particles become smaller, the ratio of the number of surface atoms to those in the interior increases. This leads to the surface properties playing an important role in the overall properties of the material. The second factor is a change in the electronic properties of the material when the material is very small in size. At extremely small sizes quantum confinement causes the material's band gap to gradually increase as the size of the particles decrease. This effect is a consequence of the confinement of an 'electron in a box' giving rise to discrete energy levels similar to those observed in atoms and molecule rather than a continuous band as observed in the corresponding bulk semiconductor material. Thus, the "electron and hole" produced by the absorption of electromagnetic radiation are closer together than they would be in the corresponding macrocrystalline material. This leads to a narrow bandwidth emission that depends upon the particle size and composition of the nanoparticle material. QDs therefore have higher kinetic energy than the corresponding macrocrystalline material and consequently the first excitonic transition (band gap) increases in energy with decreasing particle diameter.

QD nanoparticles of a single semiconductor material tend to have relatively low quantum efficiencies due to electron-hole recombination occurring at defects and dangling bonds situated on the nanoparticle surface, which may lead to non-radiative electron-hole recombinations. One method to eliminate such defects and dangling bonds on the inorganic surface of the QD is to grow a second inorganic material, having a wider band-gap and small lattice mismatch to that of the core material, epitaxially on the surface of the core particle, producing a "core-shell" particle. Core-shell particles separate any carriers confined in the core from surface states that would otherwise act as non-radiative recombination centers. One example is QDs having a ZnS shell grown on the surface of a CdSe core.

Rudimentary QD-based light-emitting devices have been made by embedding colloidally produced QDs in an optically clear LED encapsulation medium, typically a silicone or an acrylate, which is then placed on top of a solid-state LED. The use of QDs potentially has some significant advantages over the use of the more conventional phosphors, such as the ability to tune the emission wavelength, strong absorption properties, improved color rendering, and low scattering.

For the commercial application of QDs in next-generation light-emitting devices, the QDs are preferably incorporated into the LED encapsulating material while remaining as fully mono-dispersed as possible and without significant loss of quantum efficiency. The methods developed to date are problematic, not least because of the nature of current LED encapsulants. QDs can agglomerate when formulated into current LED encapsulants, thereby reducing the optical performance of the QDs. Moreover, once the QDs are incorporated into the LED encapsulant, oxygen can migrate through the encapsulant to the surfaces of the QDs, which can lead to photo-oxidation and, as a result, a drop in quantum yield (QY).

One way of addressing the problem of oxygen migration to the QDs has been to incorporate the QDs into a medium with low oxygen permeability to form "beads" of such a material containing QDs dispersed within the bead. The QD-containing beads can then be dispersed within an LED encapsulant. Examples of such systems are described in U.S. patent application Ser. No. 12/888,982, filed Sep. 23, 2010 (Pub. No.: 2011/0068322) and Ser. No. 12/622,012, filed Nov. 19, 2009 (Pub. No.: 2010/0123155), the entire contents of which are incorporated herein by reference.

Films containing QDs are described herein. FIG. 1 illustrates a prior art embodiment 100, wherein a QD-containing film 101 is disposed on a transparent substrate 102. Such a film can be useful, for example, to down-convert primary light 103 from a primary light source 104 by absorbing primary light 103 and emitting secondary light 105. A portion 106 of primary light may also be transmitted through the film and substrate so that the total light emanating from the film and substrate is a mixture of the primary and secondary light.

QD-containing films, such as film 101 in FIG. 1, may be formed by dispersing QDs in a polymer resin material and forming films of the material using generally any method of preparing polymer films known in the art. It has been found that QDs are generally more compatible with hydrophobic resins, such as acrylates, compared to more hydrophilic resins, such as epoxies. Thus, polymer films made of QDs dispersed in acrylates tend to have higher initial quantum yields (QYs) than QD films using hydrophilic resins such as epoxy resins. However, acrylates tend to be permeable to oxygen, while epoxy resin polymers and similar hydrophilic polymers tend to be better at excluding oxygen.

Figure 2:
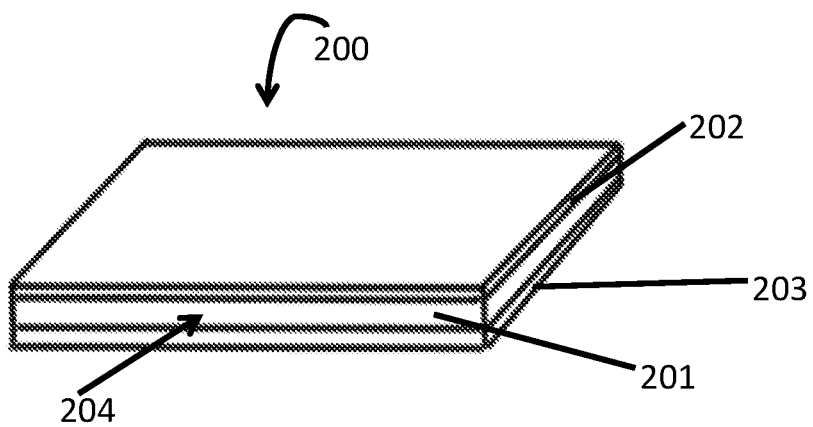
FIG. 2 illustrates a QD-containing film coated with gas-barrier sheets.

One alternative for achieving high QY associated with QD-containing hydrophobic films, while also maintaining stability of the QY over time, is to insulate the film from oxygen by sandwiching the film between gas barrier sheets, as illustrated in FIG. 2. FIG. 2 illustrates a panel 200 having a polymer film 201 contained between gas barrier sheets 202 and 203. The polymer film 201 contains QDs dispersed throughout. Gas barrier sheets 202 and 203 serve to prevent oxygen from contacting the dispersed QDs. However, even in an embodiment as illustrated in FIG. 2, oxygen can permeate into the film at edges 204, resulting in a deterioration of the QY of the film.

One solution to this problem is to seal edges 204 with an oxygen barrier. However, doing so adds cost to the production of panel 200. Another option is to use a polymer 201 that is less permeable to oxygen. But as explained above, QDs are generally less compatible with such polymer resins, and therefore the optical properties of devices utilizing such polymers are less than ideal.

Another option is to use multi-phase systems wherein the QDs are suspended in a hydrophobic polymer, such as an acrylate, and the hydrophobic polymer is surrounded with a more oxygen-impermeable material, such as epoxy. For example, beads of acrylate-suspended QDs can be coated with an epoxy resin. Typically, QDs are suspended in an acrylate polymer, such as lauryl (meth)acrylate and a cross-linker, such as trimethylolpropane tri(meth)acrylate. The polymer matrix is then cured, for example, by using photocuring (typically using photoinitiators such as Igracure).

It has been found that suspending the QDs in an acrylate matrix results in a substantial redshift of the emission spectrum, which is typically undesirable. The redshift is believed to arise from two causes. First, acrylate polymers are typically less hydrophobic than the ligands attached to the surfaces of the QDs. That slight incompatibility causes a redshift. Also, upon curing of the acrylate polymer, the emission tends to redshift even further. The process disclosed herein does not result in such red-shifted emission.

The disclosed compositions and processes are based on creating a host matrix for the QDs whereby the QDs are maximally dispersed in a hydrophobic environment that is highly compatible with QD surfaces. One example of a suitable host matrix is isopropyl myristate (IPM). Hydrophobic compounds with structures similar to IPM can be used as host phases. Other examples include fatty acid esters and ethers, isopropyl myristate, isopropyl palmitate, phenyl palmitate, phenyl myristate, natural and synthetic oils, heat transfer liquids, fluorinated hydrocarbons, dibutyl sebacate, and diphenyl ether.

Host matrices such as IPM and the other hydrophobic materials mentioned above have the advantage that they are compatible with the hydrophobic surfaces of the QDs. Also, the matrices are not cured. Both of those properties minimize redshift. However, because they are not cured polymer matrices, such matrices tend to lack rigidity. To impart rigidity, and to de-aggregate (i.e., space apart) the QDs within the host matrix, a scaffolding or support material can be used to hold the nanoparticles dispersed in place. The scaffolding or support material can be any low polarity material with high surface area. The scaffolding material should be benign to both the dots and solvent. Examples of suitable scaffolding or support materials are: fumed silica (Aerosils), fumed alumina, hydrophobic polymers (such as polyisoprene, cellulose esters, polyesters, polystyrene, porous polymer beads, and lipophilic Sephadex® a crosslinked dextran gel.

QDs can be suspended in a hydrophobic host matrix, along with scaffolding or support material. The suspension can then be used to make a two-phase system by forming an emulsion of the host phase with an outer phase, which is typically a more hydrophilic and oxygen impermeable material, such as an epoxy resin. Examples of suitable outer phase materials include epoxy resins such EPO-TEK OG142, which is a commercially available single component, low viscosity epoxy. Other suitable outer phase materials include Sartomer CN104C80 (a Bisphenol A based oligomer diluted with hydroxyethyl acrylate (HEA) with photoinitiators and inhibitors).

According to some embodiments, high glass transition temperature epoxy resins facilitate oxygen barrier as well as stable polymeric films at high temperature. The acrylates-based bisphenol A epoxy resins display fast curing rates. Hydroxy (meth)acrylates, such as 2-hydroxy ethyl acrylate (HEA), 2-hydroxy ethyl methacrylate (HEMA), hydroxy propyl acrylate (HPA), hydroxy propyl methacrylate (HPMA) or carboxylic acid (meth)acrylates such as 2-carboxy ethyl (meth)acrylate oligomer (CEAO or CEMAO), acrylic acid (AA), methacrylic acid (MMA) are used in the formulations to improve adhesion to gas barrier films and to adjust resin viscosity without affecting oxygen barrier property of bisphenol A-epoxy acrylates. It should be noted that polymer of HPA ($T_g$=22° C.), HPMA ($T_g$=76° C.) and HEMA ($T_g$=109° C.) show thermo-responsive behavior in aqueous solutions and become hydrophobic at temperature ≥40° C., indicating that the films are less sensitive to humidity. Polymers of (meth)acrylic acid, which show high glass transition temperature ($T_g$ of PMAA=220° C.; $T_g$ of PAA=70-106° C.) in some formulations with CN104 are also advantageous to ensure that the films are stable at high temperature.

EXAMPLES

Both red and green core-shell QDs having a core of InP alloyed with Zn and S, and shells of ZnS were prepared as described in U.S. Pat. No. 7,588,828, the entire contents of which are incorporated herein by reference. It will be appreciated that the methods described herein can be used with any QD materials.

Example 1: Dispersion of Red QDs in IPM 0.045 mL of red QD dispersion in toluene containing 3.3 OD was added to a vial. Toluene was then evaporated prior to addition of 1 mL degassed IPM. The mixture was stirred at 300 rpm for 2 hours in nitrogen to re-disperse the QDs. The red QD in IPM was then transferred to cuvettes in nitrogen.

Example 2: Two-Phase Resins with IPM Host Phase 0.726 mL toluene dispersion of green QDs containing 60 OD was added to a vial and toluene was evaporated. The vial was then heated on a 40° C. heating block under vacuum for one hour to remove any remaining solvent. 1.5 mL degassed IPM was added to the solid residue under nitrogen and stirred at 300 rpm to re-disperse the QDs affording red QDs dispersion in IPM (1). 0.15 mL of (1) was added to 0.5 mL of epoxy (EPO-TEK OG142) in nitrogen. The mixture was stirred at 300 rpm for 20 min and the resultant two phase QDs resin was then encapsulated between two gas barrier layers (3M) and cured for 1.5 min using a mercury lamp in nitrogen affording about 100 micrometer thick QD films.

Example 3: Two-Phase Resins with IPM/Silica Host Phase

The two-phase resins of this examples uses IPM as a host phase, wherein the host phase contains both red and green QDs and fumed silica (as a support). The two-phase resin includes epoxy as an outer phase.

A 2 mL toluene dispersion of red QDs containing 209.5 OD@450 nm was added to a vial and the solvent was evaporated at 20° C. under vacuum. The vial was then heated on 40° C. heating block under vacuum for one hour to remove any remaining solvent. 1.7 g degassed IPM was added to the solid residue under nitrogen and stirred to re-disperse the QDs affording 116.8 OD red QDs per gram dispersion (2).

8 mL toluene dispersion of green QDs containing 504.8 OD@450 nm was added to another vial and the solvent was evaporated at 20° C. under vacuum. The vial was then heated on 40° C. heating block under vacuum for one hour to further remove any remaining solvent. 10.12 g degassed IPM was added to the solid residue under nitrogen to re-disperse the QDs affording 128.79 OD green QDs per gram dispersion (3).

To make QDs dispersion in IPM (4) at concentration of 5.26 OD red and 36.84 OD green QDs @450 nm per gram 0.858 gram of (2) and 13.284 gram of (3) were first mixed under nitrogen then 1.862 gram of degassed IPM were added. 0.386 gram of Aerosil R106 as colloidal stabilizer was then added to 7 grams of (4) affording QDs dispersion (5) with 5% Aerosil R106 in IPM.

To make two-phase resins, 1 gram of (4) was added to 4 grams of outer phase resin (Sartomer epoxy acrylate CN104B80 containing 20 wt % 1, 6 hexadiol diacrylate and 1 wt % Irgacure 819 photoinitiator). The mixture was mixed at 300 rpm for 30 min under nitrogen. The resultant two-phase QDs resin was then laminated between gas barrier layers on a laminator and cured for 30 s using a mercury lamp affording ca 100 micrometer thick QD films.

Example 4: Preparation of Outer Phase Resin

The outer phase resin is Sartomer CN104C80 (a Bisphenol A based oligomer diluted with hydroxyethyl acrylate (HEA) with photoinitiators and inhibitors). CN104 was heated to 55° C. to allow for the material to become readily pourable; at room temperature the material is estimated to have a viscosity well above 500000 cps (note that larger quantities may require overnight heating with a barrel jacket). CN104 was decanted into a Schott bottle. CN104 was allowed to cool for at least 2 hours (this is because the diluent used (HEA) is thermally sensitive). HEA was charged into the bottle. A SS impellor (anchor or paddle with holes) was used to manually incorporate the material until the material was relatively homogenous. The material was stirred via O/H stirrer at a speed giving turnover of material. Stirring was stopped from time to time to allow for manual scraping of the CN104 from the sides and base of the Schott bottle. When the mixture was mostly homogenous, photoinitiator (Irgacure 819) and inhibitors (4-hydroxy-TEMPO) were added and stirring continued. Once fully homogenous, stirring was stopped and the material was allowed to stand overnight to allow for bubbles created by turbulent stirring to be released. The material was degassed under high vacuum (<1 mbar). Once the foam was completely broken, the material was left under high vacuum for at least 30 minutes. Three vacuum/$N_2$ cycles were performed and the material transferred to the glove box to be recapped/used.

Example 5: Comparison of QD Dispersions and Films

The QDs were dispersed in IPM having high boiling point (340° C.). Table 1 summarizes optical performance of the red QDs dispersed in toluene and IPM. The concentration is measured at 550 nm.

TABLE 1

| Host Material | Con. (OD/ml) | PL (nm) | FWHM (nm) | QY (%) | EQE (%) | LED Absorbance |
|---|---|---|---|---|---|---|
| Toluene | Dil. | 611 | 57 | 78 | N/A | N/A |
| IPM | 3.3 | 617 | 53 | 56 | 55 | 74 |
| IPM | 6.6 | 622 | 53 | 58 | 55 | 88 |
| IPM | 13.2 | 628 | 53 | 60 | 53 | 96 |

Green core-shell QDs having a core of InP alloyed with Zn and S, and shells of ZnS were prepared as described in U.S. Pat. No. 7,588,828. Green QDs typically show a significant PL redshift in two phase resins/films using LMA/TMPTM as the inner phase (i.e., the QD host phase). For example, 20 nm or 23 nm PL redshift is observed for 7 OD green QDs per gram two-phase resins using LMA/TMPTM as inner phase and epoxy-based resins (e.g., Sartomer CN104B80) as outer phases. The PL redshift limits the possibility of using higher QD loadings and requires shorter wavelength PL green QDs, which typically have lower QY and stability.

Table 2 summarizes optical properties of green QDs in two-phase resins before and after curing before and after curing using LMA/TMPTM inner phase and Sartomer CN104B80 as outer phase. The weight ratio of inner phase (IP) and outer phase (OP) is 20/80. Concentration of red and green QDs in the two-phase resin is 0.7 and 7 OD per gram respectively. As shown in Table 2, about 15 nm redshift for green QDs in two-phase resin is observed even before curing. QY of QDs in two-phase resins is 60% indicating that LMA/TMPTM inner phase is more polar than QD surface ligands. After curing additional 5 nm PL redshift and 10% lower QY are observed for QDs films. The data clearly show that more hydrophobic/compatible hosting materials and minimal exposure of QDs to free radicals are needed.

TABLE 2

| QDs in Toluene | | | Resin before Cure | | Two-Phase Resin After Cure | | | |
|---|---|---|---|---|---|---|---|---|
| PL | FWHM | QY | QY | PL | QY | PL | EQE | FWHM |
| 527 | 45 | 75 | 60 | 543 | 60 | 548 | 39 | 44 |
| 527 | 45 | 75 | 60 | 541 | 60 | 546 | 38 | 43 |

Figure 3:
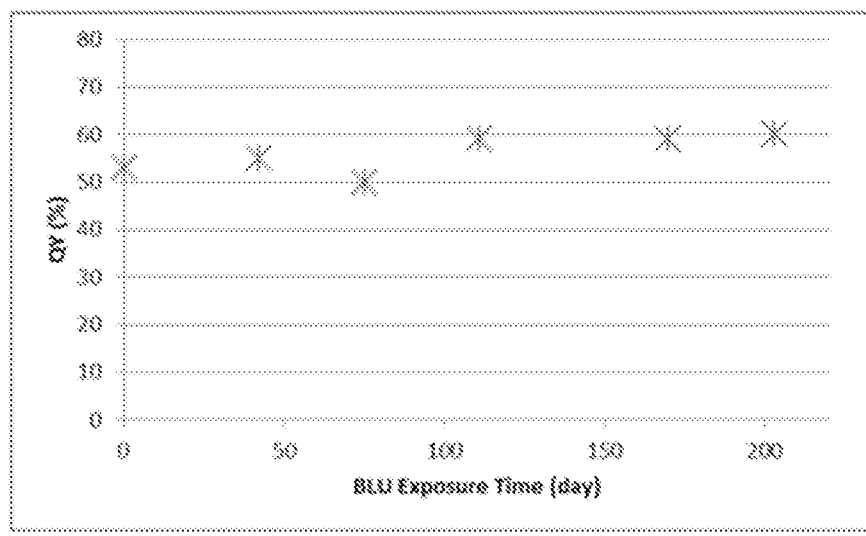
FIG. 3 shows the quantum yield (QY) v. time for QD films using IPM as the host phase and epoxy (OG142) as the outer phase.

As shown in FIG. 3, two phase QD films using IMP as the inner (host) phase and epoxy (OG142) as the outer phase show constant QY over 6 months on a backlighting unit. This shows that the QDs are stable in the presence of the IMP host phase.

The two-phase resin system can be improved by introducing a scaffolding or support material into the host phase of the two-phase resin. Table 3 shows the optical properties of films using green QDs in an IPM host phase that includes a hydrophobic fumed silica support for the QDs. The support material is Aerosil R106, a hydrophobic fumed silica treated with octamethylcyclotetrasiloxane. The support material introduces a thixotropic property to the IMP/QD phase; the host phase is a solid or paste at zero shear force but behaves as liquid under high shear force. The host phase is used to make a two-phase resin, with epoxy (CN104 with 20% HDDA) as an outer phase.

TABLE 3

Films of 7 OD/g green QDs in IPM/Aerosil as a host phase and epoxy (CN104 with 20% HDDA) as an outer phase.

| PL in toluene (nm) | Aerosil (%) | PL Film (nm) |
|---|---|---|
| 525 | 10 | 535 |
| 526 | 5 | 535 |
| 526 | 10 | 535 |
| 523 | 5 | 532 |
| 526 | 5 | 535 |

As shown in Table 3, the redshift of the QDs in films having a host phase of IPM and the support material is only about 10 nm. That is an improvement over the redshift observed with green QDs in LMA/TMPTM. Including the scaffolding material in the host phase alleviates the need for curing the host material resin. As shown in Table 2, the curing process induces a redshift, which is avoided by using the scaffolding material. Moreover, the QDs are more compatible with the hydrophobic environment of the IPM, also resulting in a smaller redshift.

Table 4 shows the peak photoluminescence wavelengths for films of red QDs in an IPM including Aerosil R106 as a support. The host phase is used to make a two-phase resin, with epoxy (CN104 with 20% HDDA) as an outer phase.

TABLE 4

Films of 7 OD/g red QDs in IPM/Aerosil as a host phase and epoxy (CN104 with 20% HDDA) as an outer phase.

| PL in toluene (nm) | Aerosil (%) | PL Film (nm) |
|---|---|---|
| 625 | 10 | 622 |
| 634 | 5 | 634 |
| 634 | 10 | 634 |
| 634 | 5 | 634 |
| 637 | 5 | 636 |

As shown in Table 4, the two-phase system using IPM/Aerosil as a host phase and epoxy as an outer phase result in films having no redshift in the emission peak of the red QDs.

Hydrophobic compounds with structures similar to IPM can be used as host phases. Examples include dibutyl sebacate, dioctyl sebacate, isopropyl stearate and isopropyl palmitate.

Example 6: Resin Formulations Based on Sartomer CN104 and Carboxylic Acid (meth)acrylates 4.00 g of 2-carboxy ethyl acrylate oligomer (CEAO) were added to a Duran amber bottle containing 0.202 g of Irgacure 819 previously dissolved in 1 mL THF and pre-mixed in air. 16.00 g of CN104 were then added and the mixture was mechanically stirred at 100 rpm overnight in air before removing THF and being degassed via vacuum and nitrogen cycles affording resin 1.

To make two phase QD resins and films, 4.00 g of resin 1 were added to 1.00 g inner phase containing 35 OD green and 5 OD red QDs and 5% wt aerosil R106 dispersed in isopropyl myristate. The mixture was stirred for 20 min at 300 rpm in nitrogen. The two phase QD resin was laminated between D barrier films on a laminator and cured with a mercury lamp for 30 s in air.

Example 7: Resin Formulations Based on Sartomer CN104 and Carboxylic Acid (meth)acrylates Outer phase preparation: CN104 (14.60 g, Sartomer) was transferred into an amber 100 mL bottle. A solution of methacrylic acid (MAA) (6.60 g, Aldrich) with dissolved photoinitiator Irgacure 819 (0.21 g, Aldrich) was prepared and added to the bottle. The mixture was stirred using an overhead stirrer for 6 hours in the dark affording resin 2.

QD resin: Inner phase IPM solution was prepared by drying red and green QDs separately and dissolving in IPM. A white inner phase solution containing 3.5 OD/g red and 35 OD/g green was prepared by mixing red solution, green solution, IPM and 5 wt % aerosil R106 together.

The final resin was prepared by adding 1.00 g of degassed white inner phase to 4.00 g of degassed outer phase to give a final concentration of 0.7 OD/g red and 7 OD/g green. The resin was laminated between D barrier films on a laminator and cured for 30 s under an Hg lamp in air.

Example 8: Resin Formulations Based on Sartomer CN104 and Hydroxy Acid (meth)acrylates 10.00 g of 2-hydroxy ethyl acrylate (HEA) were added to a Duran amber bottle containing 1.00 g Irgacure 819 and stirred with a magnetic at 300 rpm for 15 min prior to addition of 39.00 g of CN104. The mixture was mechanically stirred in air until it became homogeneous before being degassed via vacuum and nitrogen cycles, giving resin 3.

CN104/HEA based resins with different viscosity can be obtained by varying the fraction of HEA in the formulations (see Table 5) without affecting BLU stability of the resultant QD films (Table 7).

TABLE 5

CN104/HEA based resins using different HEA concentration and 1% Irg819.

| HEA (% on CN104) | Mass of CN104 (g) | Mass of HEA (g) | Mass of CN104 and HEA (g) | Mass of Irg819 (g) |
| --- | --- | --- | --- | --- |
| 10 | 17.93 | 1.99 | 19.92 | 0.199 |
| 15 | 17.30 | 3.05 | 20.35 | 0.203 |
| 20 | 16.15 | 4.04 | 20.19 | 0.202 |
| 25 | 15.40 | 5.13 | 20.53 | 0.205 |
| 30 | 14.43 | 6.18 | 20.61 | 0.206 |
| 35 | 12.98 | 6.99 | 19.97 | 0.200 |
| 40 | 12.26 | 8.17 | 20.43 | 0.204 |

Two phase QD resins and films using aerosil R106: 4.00 g of resin 3 were added to 1.00 g inner phase containing 35 OD green and 5 OD red QDs and 5% or 10% wt aerosil R106 dispersed in IPM. The mixture was stirred for 20 min at 300 rpm in nitrogen. The two-phase QD resin was laminated between D barrier films on a laminator and cured with a mercury lamp for 30 s in air.

Two-phase QDs resins with polyisoprene: 4.00 g of resin 3 were added to 1.00 g inner phase containing 35 OD green and 5 OD red QDs and 50% wt polyisoprene (cis, average $M_w$=40,000 g/mol) in IPM. The mixture was stirred for 20 min at 300 rpm in nitrogen. The two phase QD resin was laminated between D barrier films on a laminator and cured with a mercury lamp for 30 s in air.

Example 9: Resin Formulations Based on Sartomer CN104 and Hydroxy Acid (meth)acrylates 10.00 g of 2-hydroxy propyl acrylate (HPA) were added to a Duran amber bottle containing 1.02 g Irgacure 819 and stirred at 300 rpm for 15 min prior to addition of 40.00 g of CN104. The mixture was mechanically stirred in air until it became homogeneous before being degassed via vacuum and nitrogen cycles affording resin 4.

Two phase QD resins and films using aerosil R106: 4.80 g of resin 4 were added to 1.20 g inner phase containing 35 OD/g green and 5 OD/g red QDs and 5% wt aerosil R106 dispersed in isopropyl myristate. The mixture was stirred for 20 min at 300 rpm in nitrogen. The two-phase QD resin was laminated between D barrier films on a laminator and cured with a mercury lamp for 30 s in air.

Example 10: Resin Formulations Based on Sartomer CN104 and Hydroxy Acid (meth)acrylates 20.00 g of 2-hydroxy ethyl methacrylate (HEMA) were added to a Duran amber bottle containing 1.36 g Irgacure 819. The mixture was stirred at 300 rpm for 15 min prior to addition of 46.67 g of CN104. The mixture was mechanically stirred until it became homogeneous before being degassed via vacuum and nitrogen cycles affording resin 5.

Two phase QD resins and films using aerosil R106: 4.40 g of resin 5 were added to 1.10 g inner phase containing 35 OD/g green and 5 OD/g red QDs and 5% wt aerosil R106 dispersed in isopropyl myristate. The mixture was stirred for 20 min at 300 rpm in nitrogen. The two-phase QD resin was laminated between D barrier films on a laminator and cured with a mercury lamp for 30 s in air.

Example 11: Resin Formulations Based on Sartomer CN104 and Hydroxy Acid (meth)acrylates 20.00 g of 2-hydroxy propyl methacrylate (HPMA) were added to a Duran amber bottle containing 1.36 g of Irgacure 819 and stirred at 300 rpm for 15 min prior to addition of 46.67 g of CN104. The mixture was mechanically stirred in air until it became homogeneous before being degassed via vacuum and nitrogen cycles affording resin 6.

Two phase QD resins and films using aerosil R106: 4.40 g of resin 6 were added to 1.10 g inner phase containing 35 OD green and 5 OD red QDs and 5% wt aerosil R106 dispersed in IPM. The mixture was stirred for 20 min at 300 rpm in nitrogen. The two-phase QD resin was laminated between D barrier films on a laminator and cured with a mercury lamp for 30 s in air.

Adhesion Evaluation.

Adhesion of the encapsulated QD films with barrier layers was evaluated by manually pulling barrier layers apart. Table 6 summarizes adhesion of the formulations with different barrier layers.

TABLE 6

QD film adhesion to different barrier layers qualitatively evaluated by pulling the barrier layers apart.

| Outer phase | Inner Phase | Barrier Layers | Adhesion | Description |
|---|---|---|---|---|
| OG603/20% HDDA | LMA + TMPTM | A | Good | Relatively hard to remove barrier layers from QD film |
| OG142 | LMA + TMPTM | A | Good | Relatively hard to remove barrier layers from QD film |
| CN104/20% HDDA | IPM/Aerosil 5-10% or LMA + TMPTM | B | Poor | Easy to remove barrier layers from QD film |
| CN104/20% HDDA | IPM/Aerosil 5-10% | A | Poor | Easy to remove barrier layers from QD film |
| CN104/20% HDDA | IPM/Aerosil 5-10% | C, D | Good | Relatively hard to remove barrier layers from QD film |
| CN104/20% PEGDA | IPM/Aerosil 5-10% | C, D | Good | Relatively hard to remove barrier layers from QD film |
| CN104/15-40% HEA | IPM/Aerosil 5-10% | C, D | Excellent | Impossible to remove barrier layers from QD film |
| CN104/20% HPA | IPM/Aerosil 5-10% | C, D | Excellent | Impossible to remove barrier layers from QD film |
| CN104/20-30% HEMA | IPM/Aerosil 5-10% | C, D | Excellent | Impossible to remove barrier layers from QD film |
| CN104/20% HPMA | IPM/Aerosil 5-10% | C, D | Excellent | Impossible to remove barrier layers from QD film |
| CN104/20% MAA | IPM/Aerosil 5-10% | C, D | Excellent | Impossible to remove barrier layers from QD film |
| CN104/20% AA | IPM/Aerosil 5-10% | C, D | Excellent | Impossible to remove barrier layers from QD film |

It is clear that QD films based on CN104 and hydroxy or carboxy (meth)acrylates show excellent adhesion to films C and D. Good adhesion of the QD films to barrier layers allows the former to be mechanically and thermally stable.

Table 7 summarizes optical performance data obtained for white QD films prepared from the same inner phase and different CN104/HEA outer phase formulations. QY/EQE and stability of the films appeared not affected by the HEA fraction in the outer phase, suggesting that it is possible to formulate resins having different viscosity without compromising their films optical performance and stability. The films were prepared from the same inner phase and different CN104/HEA outer phase resins. Inner phase contained 35 OD/g green and 5 OD/g red QDs and 5% aerosil R106 dispersed in IPM. Weight ratio of outer phase to inner phase was 1/4. The QD films were made between D barrier layers on a laminator in air and cured for 30 s after 30 s resin relaxation.

TABLE 7

QY and EQE versus time of two phase QD films on 2.5 mW BLU.

| Film | HEA content (wt %) | Day | QY (%) | EQE (%) | LED Absorbed (%) |
|---|---|---|---|---|---|
| 85% CN104, 15% HEA + 1% Irg819 | 15 | 0 | 61 | 48 | 62 |
| | | 5 | 65 | 51 | 61 |
| | | 28 | 62 | 49 | 60 |
| | | 47 | 61 | 49 | 60 |
| | | 75 | 63 | 50 | 60 |
| 80% CN104, 20% HEA + 1% Irg819 | 20 | 0 | 59 | 47 | 56 |
| | | 5 | 62 | 51 | 55 |
| | | 28 | 61 | 49 | 54 |
| | | 47 | 60 | 48 | 53 |
| | | 75 | 61 | 49 | 53 |
| 75% CN104, 25% HEA + 1% Irg819 | 25 | 0 | 61 | 47 | 56 |
| | | 5 | 64 | 49 | 55 |
| | | 28 | 60 | 49 | 54 |
| | | 47 | 59 | 48 | 54 |
| | | 75 | 60 | 49 | 54 |
| 70% CN104, 30% HEA + 1% Irg819 | 30 | 0 | 60 | 48 | 58 |
| | | 5 | 63 | 52 | 57 |
| | | 28 | 61 | 49 | 56 |
| | | 47 | 60 | 49 | 56 |
| | | 75 | 61 | 49 | 56 |
| 65% CN104, 35% HEA + 1% Irg819 | 35 | 0 | 62 | 48 | 57 |
| | | 5 | 65 | 48 | 57 |
| | | 28 | 60 | 51 | 56 |
| | | 47 | 60 | 49 | 56 |
| | | 75 | 61 | 50 | 55 |
| 60% CN104, 40% HEA + 1% Irg819 | 40 | 0 | 62 | 47 | 47 |
| | | 5 | 64 | 50 | 53 |
| | | 28 | 60 | 48 | 55 |
| | | 47 | 60 | 49 | 55 |
| | | 75 | 60 | 47 | 55 |

Figure 4:
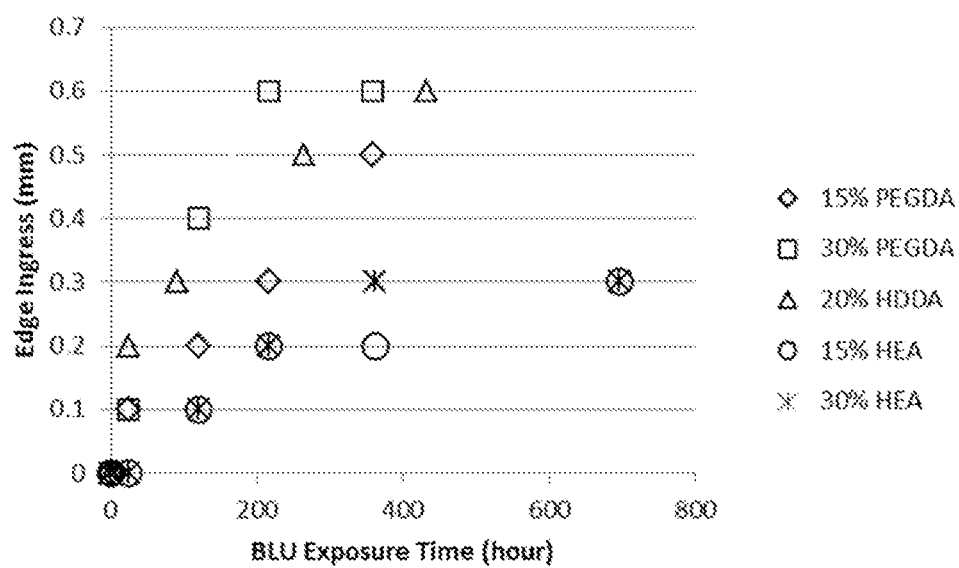
FIG. 4 shows effect of different adhesion promoters in CN104 formulations on edge ingress of the resultant QD films.

FIG. 4 shows effect of different adhesion promoters in CN104 formulations on edge ingress of the resultant QD films. It is clear that common adhesion promoters PEG diacrylate (PEGDA, Mn=575 g/mol) and 1,6 hexadiol diacrylate in CN104 decreased stability of the QD films. For example, edge ingress of 15% and 30% PEGDA-based films increased with BLU exposure time and reached 0.3 mm and 0.6 mm after 200 hours on BLU respectively. 20% HDDA-based films also show ca.0.4 mm edge ingress while 15% and 30% HEA-based films show 0.3 mm ingress and remain unchanged after 700 hours under the same testing conditions. This suggests that the use of HEA adhesion promoter does not affect oxygen barrier property of the CN104 bisphenol A epoxy acrylate.

Figure 5:
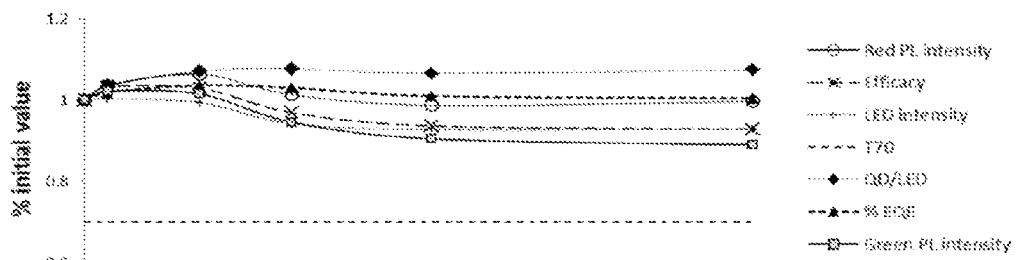
FIG. 5 shows stability of the two phase QD film based on 20% HEA in CN104 resins.
Figure 6:
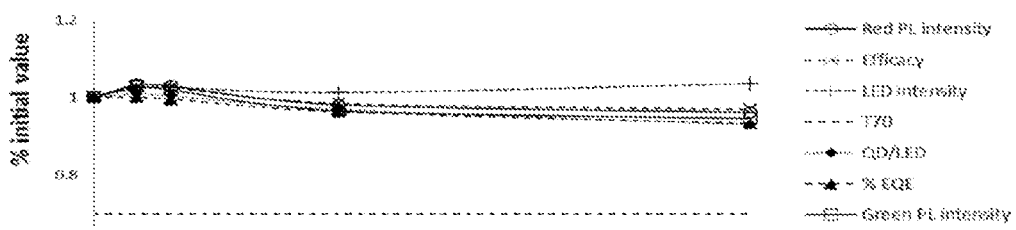
FIG. 6 shows stability of the two-phase QD film using 20% MAA/CN104 outer phase resin.
Figure 7:
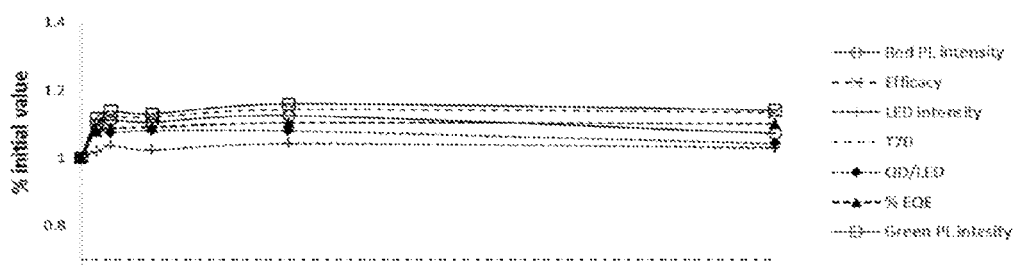
FIG. 7 shows stability of the two-phase QD film based on IPM/polyisoprene inner phase and CN104/20% HEA outer phase resin.

FIG. 5 shows stability of the two phase QD film based on 20% HEA in CN104 resins. The edge ingress of the white film was 0.3 mm after 362 hours and remained the same after 700 hours on BLU. Monitoring of edge ingress of this film has been continued to confirm if the ingress was caused by delamination of barrier layers or mechanical damage due to films cutting. FIG. 6 shows stability of the two-phase QD film using 20% MAA/CN104 outer phase resin. The edge ingress of the white film was 0.1 mm after 143 hours and remained at 0.2 mm after 383 hours on BLU. It should be noted that stability of two-phase QD films is also affected by the composition of the inner phase. Addition of more polar component such as dibutyl sebacate (DBS) or C12-C15 alkyl benzoate could affect stability of two-phase QD films. This is perhaps due to the diffusion of these compounds in the inner phase into the outer phase changing gas barrier property of the latter. Therefore good phase separation between inner phase and outer phase is preferred. FIG. 7 shows stability of the two-phase QD film based on IPM/polyisoprene inner phase and CN104/20% HEA outer phase resin. The edge ingress of the white film has remained constant at 0.1 mm for 1122 hours on BLU.

The foregoing description of preferred and other embodiments is not intended to limit or restrict the scope or applicability of the inventive concepts conceived of by the Applicants. It will be appreciated with the benefit of the present disclosure that features described above in accordance with any embodiment or aspect of the disclosed subject matter can be utilized, either alone or in combination, with any other described feature, in any other embodiment or aspect of the disclosed subject matter.

What is claimed is:

1. A light emitting device, the light emitting device comprising:
   a primary light emitting element; and
   a quantum dot (QD)-containing two-phase composition in optical communication with the primary light emitting element, the two-phase composition comprising:
      a hydrophobic inner phase comprising a hydrophobic solvent selected from fatty acid esters and ethers, isopropyl myristate, isopropyl palmitate, phenyl palmitate, phenyl myristate, natural and synthetic oils, heat transfer liquids, fluorinated hydrocarbons, dibutyl sebacate, and diphenyl ether;
      a population of QDs dispersed within the inner phase; and
      a hydrophilic outer phase.

2. The light emitting device of claim 1, wherein the QD-containing two-phase composition is in the form of a film.

3. The light emitting device of claim 2, wherein the film is disposed between two gas barrier layers.

4. The light emitting device of claim 1, wherein the inner phase of the two-phase composition further comprises a scaffolding material.

5. The light emitting device of claim 4, wherein the scaffolding material is fumed silica, fumed alumina, a hydrophobic polymer, porous polymer beads, or a lipophilic cross-linked dextran gel.

6. The light emitting device of claim 1, wherein the outer phase of the two-phase composition is an epoxy resin.

7. The light emitting device of claim 1, wherein the outer phase of the two-phase composition is a bisphenol A-epoxy resin.

8. The light emitting device of claim 1, wherein the outer phase of the two-phase composition comprises a polymer having a glass transition temperature of about 50° C. or greater.

9. The light emitting device of claim 1, wherein the outer phase of the two-phase composition comprises an epoxy-acrylate resin and one or more of 2-hydroxy ethyl acrylate (HEA), 2-hydroxy ethyl methacrylate (HEMA), hydroxy propyl acrylate (HPA), hydroxy propyl methacrylate (HPMA) or a carboxylic acid (meth)acrylate.

10. The light emitting device of claim 9, wherein the carboxylic acid (meth)acrylate is any one of 2-carboxy ethyl (meth)acrylate oligomer CEMAO), 2-carboxy ethyl acrylate oligomer (CEAO), acrylic acid (AA), or methacrylic acid (MMA).

* * * * *